United States Patent
Horio

(10) Patent No.: US 8,053,800 B2
(45) Date of Patent: Nov. 8, 2011

(54) REFLECTION-TYPE PHOTOINTERRUPTER

(75) Inventor: Tomoharu Horio, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/611,347

(22) Filed: Nov. 3, 2009

(65) Prior Publication Data
US 2010/0109021 A1    May 6, 2010

(30) Foreign Application Priority Data

Nov. 4, 2008  (JP) ................ 2008-282826
Nov. 5, 2008  (JP) ................ 2008-284255

(51) Int. Cl.
*H01L 31/12*  (2006.01)
*H01L 31/16*  (2006.01)

(52) U.S. Cl. ............. 257/98; 257/81; 257/82; 257/99; 257/433; 257/435; 257/E25.02; 257/E25.032; 257/E27.131; 257/E31.117; 257/E31.119; 257/E31.127; 250/221; 250/239; 250/552

(58) Field of Classification Search ............ 257/81, 257/82, 98, 99, 433, 435, E25.02, E25.032, 257/E27.131, E31.117, E31.119, E31.127; 280/221, 239, 552

See application file for complete search history.

(56) References Cited

U.S. PATENT DOCUMENTS

| 7,309,855 | B2* | 12/2007 | Nagasaka et al. | 250/231.14 |
| 7,652,244 | B2* | 1/2010 | Aizpuru | 250/221 |
| 7,842,957 | B2* | 11/2010 | Goh et al. | 257/82 |

FOREIGN PATENT DOCUMENTS

JP  2007-13050  1/2007

* cited by examiner

*Primary Examiner* — Dao H Nguyen
(74) *Attorney, Agent, or Firm* — Hamre, Schumann, Mueller & Larson, P.C.

(57) ABSTRACT

A reflection-type photointerrupter of the present invention includes a substrate, a light emitting element and a light receiving element. The substrate includes a first surface, a second surface opposite the first surface, and a first and a second recesses that are open in the first surface side. The light emitting element is arranged in the first recess, while the light receiving element is arranged in the second recess. The light emitting element is capable of emitting light. The light receiving element is capable of receiving the light emitted from the light emitting element and reflected by an object to be detected.

19 Claims, 5 Drawing Sheets

REFLECTION-TYPE PHOTOINTERRUPTER

BACKGROUND OF THE INVENTION

1. Field of the Invention

The present invention relates to a reflection-type photointerrupter for detecting an object by utilizing light reflection.

2. Description of the Related Art

FIG. 7 illustrates a photointerrupter X4, which is an example of conventional reflection-type photointerrupter. The photointerrupter X4 includes a substrate 91, a light emitting element 92, a light receiving element 93, a molded resin 94 and a light-shielding resin 95. The substrate 91 is in the form of a rectangular flat plate and made up of a base member 91a and a wiring portion 91b. The light emitting element 92 is arranged on the substrate 91 to emit infrared light. The light receiving element 93 is arranged on the substrate 91 to receive light and generate an electromotive force corresponding to the amount of light received. The molded resin 94 is provided on the substrate 91 to cover the light emitting element 92 and the light receiving element 93. The light-shielding resin 95 is arranged between the light emitting element 92 and the light receiving element 93. In the photointerrupter X4, when the light emitted from the light emitting element 92 is reflected by an object to be detected and received by the light receiving element 93, the light receiving element 93 generates an electromotive force corresponding to the amount of light received. Based on the electromotive force, the object is detected. This type of conventional photointerrupter is disclosed in JP-A-2007-13050, for example.

In recent years, in accordance with the size reduction of electronic devices (such as foldable mobile phones) in which a photointerrupter is to be incorporated, the thickness reduction of a photointerrupter is strongly demanded. However, the above-described photointerrupter X4 cannot sufficiently meet the demand for the thickness reduction.

The present invention has been proposed under the circumstances described above. It is therefore an object of the present invention to provide a reflection-type photointerrupter which is suitable for thickness reduction.

SUMMARY OF THE INVENTION

According to a first aspect of the present invention, there is provided a reflection-type photointerrupter including a substrate, a light emitting element and a light receiving element. The substrate includes a first surface, a second surface opposite the first surface, and a first and a second recesses that are open in a first surface side. The light emitting element, which is capable of emitting light, is arranged in the first recess. The light receiving element, which is capable of receiving the light emitted from the light emitting element and reflected by an object to be detected, is arranged in the second recess.

Preferably, in the first aspect, the light emitting element is entirely accommodated in the first recess, whereas the light receiving element is entirely accommodated in the second recess.

Preferably, the substrate includes a first pad electrode forming at least part of a surface of the first recess, a second pad electrode forming at least part of a surface of the second recess, and a first and a second mount electrodes provided in the second surface side. The light emitting element is bonded to the first pad electrode, whereas the light receiving element is bonded to the second pad electrode. The first mount electrode includes a portion overlapping the first pad electrode in an in-plane direction of the substrate, and the second mount electrode includes a portion overlapping the second pad electrode in the in-plane direction of the substrate.

Preferably, the first pad electrode and the first mount electrode are in contact with each other, whereas the second pad electrode and the second mount electrode are in contact with each other.

Preferably, the first pad electrode forms at least part of a bottom surface of the first recess, whereas the second pad electrode forms at least part of a bottom surface of the second recess.

Preferably, the first pad electrode forms at least part of a side surface of the first recess, whereas the second pad electrode forms at least part of a side surface of the second recess.

Preferably, the reflection-type photointerrupter further includes a projection made of a light-shielding material and standing on the first surface of the substrate between the first recess and the second recess. More preferably, the projection is made of the same material as that of the first pad electrode, the second pad electrode, the first mount electrode or the second mount electrode.

Preferably, the reflection-type photointerrupter further includes a molded resin covering the first surface side of the substrate. More preferably, the reflection-type photointerrupter further includes a projection made of a light-shielding material and standing on the first surface of the substrate between the first recess and the second recess, and the projection penetrates the molded resin.

Preferably, the molded resin contains dye.

Preferably, the reflection-type photointerrupter further includes a filter. The filter is provided on a side of the molded resin that is opposite the substrate and includes a portion facing the light receiving element. In this case, the light emitting element is capable of emitting light of a wavelength range including a first wavelength range, and transmittance of the filter for light of the first wavelength range is higher than transmittance of the filter for light of a second wavelength range that does not overlap the first wavelength range. The second wavelength range may be a shorter wavelength range than the first wavelength range.

Preferably, the first wavelength range is the infrared wavelength range, whereas the second wavelength range is the visible wavelength range.

In another preferred embodiment, the first wavelength range is an infrared wavelength partial range that does not include a first boundary wavelength range. The first boundary wavelength range is part of the infrared wavelength range and continuous with the visible wavelength range. The second wavelength range is a visible wavelength partial range that does not include a second boundary wavelength range. The second boundary wavelength range is part of the visible wavelength range and continuous with the infrared wavelength range. The first and the second boundary wavelength ranges form a third wavelength range. The third wavelength range is a wavelength range in which transmittance of the filter for light of the third wavelength range changes transitively between the transmittance for light of the first wavelength range and the transmittance for light of the second wavelength range.

Preferably, the filter is a reflection film that is capable of reflecting light of the second wavelength range.

Preferably, the filter is provided on the molded resin.

According to a second aspect of the present invention, there is provided a reflection-type photointerrupter including a substrate, a light emitting element, a light receiving element, a molded resin and a filter. The light emitting element, which is capable of emitting light of a wavelength range including a first wavelength range, is arranged on the substrate. The light receiving element, which is capable of receiving the light emitted from the light emitting element and reflected by an object to be detected, is arranged on the substrate. The molded resin covers the light emitting element and the light receiving element on the substrate. The filter is provided on a side of the molded resin that is opposite the substrate and includes a portion facing the light receiving element. Transmittance of the filter for light of the first wavelength range is higher than transmittance of the filter for light of a second wavelength range that does not overlap the first wavelength range. The second wavelength range may be a shorter wavelength range than the first wavelength range.

In a preferred embodiment of the second aspect, the first wavelength range is the infrared wavelength range, whereas the second wavelength range is the visible wavelength range.

In another preferred embodiment, the first wavelength range is an infrared wavelength partial range that does not include a first boundary wavelength range. The first boundary wavelength range is part of the infrared wavelength range and continuous with the visible wavelength range. The second wavelength range is a visible wavelength partial range that does not include a second boundary wavelength range. The second boundary wavelength range is part of the visible wavelength range and continuous with the infrared wavelength range. The first and the second boundary wavelength ranges form a third wavelength range. The third wavelength range is a wavelength range in which transmittance of the filter for light of the third wavelength range changes transitively between the transmittance for light of the first wavelength range and the transmittance for light of the second wavelength range.

Preferably, the filter is a reflection film that is capable of reflecting light of the second wavelength range.

Preferably, the filter is provided on the molded resin.

Preferably, the molded resin contains dye.

DETAILED DESCRIPTION OF THE PREFERRED EMBODIMENTS

Figure 1:
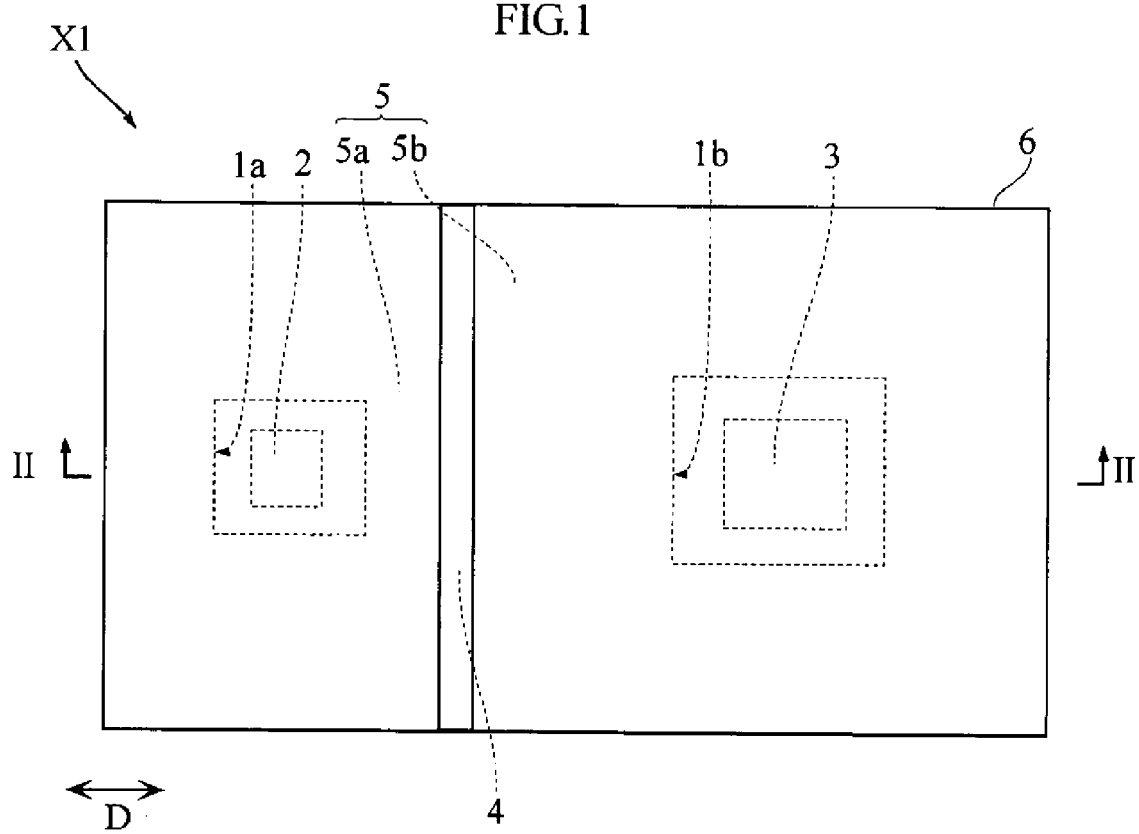
FIG. 1 is a plan view illustrating a reflection-type photointerrupter according to a first embodiment of the present invention.
Figure 2:
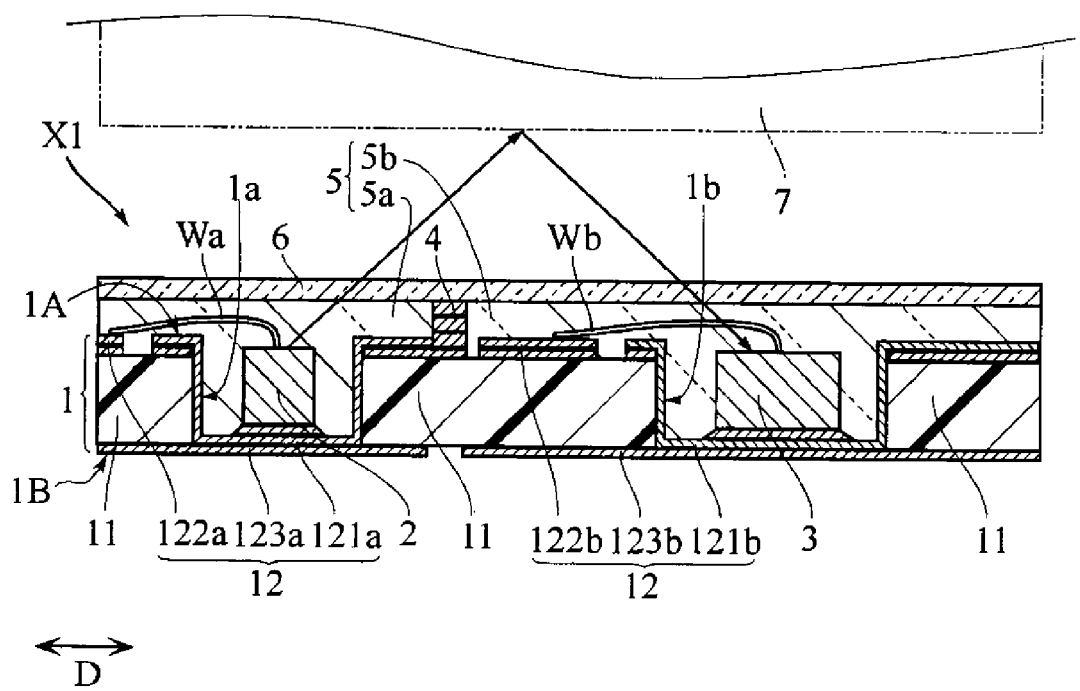
FIG. 2 is a sectional view taken along lines II-II in FIG. 1.

FIGS. 1 and 2 illustrate a reflection-type photointerrupter X1 according to a first embodiment of the present invention. The photointerrupter X1 includes a substrate 1, a light emitting element 2, a light receiving element 3, a projection 4, a molded resin 5 and a reflection film 6. The outer shape of the photointerrupter X1 shown in FIG. 1 has a size of e.g. 1.4 mm×1.3 mm. The thickness of the photointerrupter X1 shown in FIG. 2 is e.g. 0.1 to 0.2 mm. The photointerrupter X1 may be incorporated in e.g. a foldable mobile phone to detect the open/close state of the mobile phone.

The substrate 1 includes a first surface 1A, a second surface 1B, and recesses 1a and 1b which are open in the first surface 1A side. The substrate 1 includes a base member 11 and a wiring pattern 12.

The base member 11 is made of e.g. a glass fiber-reinforced epoxy resin and in the form of a rectangular plate having a size of e.g. 1.9 mm×1.3 mm. The thickness of the base member 11 is e.g. 0.05 mm. The base member 11 may be made of a material which does not transmit infrared light. Examples of such a material include liquid crystal polymer, ceramic material and polyimide.

The wiring pattern 12 includes pad electrodes 121a, 121b, bonding pads 122a, 122b and mount electrodes 123a, 123b. The pad electrode 121a of this embodiment constitutes the entirety of the inner surface of the recess 1a (including the bottom surface and side surfaces of the recess 1a) of the substrate 1. The pad electrode 121b of this embodiment constitutes the entirety of the inner surface of the recess 1b (including the bottom surface and side surfaces of the recess 1b). The bonding pads 122a and 122b are provided on the first surface 1A of the substrate 1 and electrically connected to non-illustrated mount electrodes on the second surface 1B via non-illustrated conductive vias penetrating the base member 11. The mount electrode 123a is provided on the second surface 1B of the substrate 1, includes a portion overlapping the pad electrode 121a in the in-plane direction D of the substrate 1 and is in contact with the pad electrode 121a. The mount electrode 123b is provided on the second surface 1B of the substrate 1, includes a portion overlapping the pad electrode 121b in the in-plane direction D of the substrate 1 and is in contact with the pad electrode 121b. The mount electrodes (including the mount electrodes 123a and 123b) provided on the second surface 1B serve as external connection terminals of the photointerrupter X1. In the state in which the photointerrupter X1 is incorporated in an electronic device such as a foldable mobile phone, the external circuit terminals provided at the portion on which the photointerrupter X1 is surface-mounted are electrically connected to the mount electrodes of the photointerrupter X1. The pad electrodes 121a, 121b, the bonding pads 122a, 122b and the mount electrodes 123a, 123b are made of an electrically conductive material such as copper.

The light emitting element 2 is e.g. an LED element which is capable of emitting infrared light and arranged in the recess 1a of the substrate 1. In this embodiment, the light emitting element 2 is entirely accommodated in the recess 1a. The light emitting element 2 is bonded to the pad electrode 121a, which constitutes the inner surface of the recess 1a of the substrate 1, via e.g. silver paste and electrically connected to the pad electrode 121a. The light emitting element 2 is electrically connected also to the bonding pad 122a via a bonding wire Wa.

The light receiving element 3 is a photoelectric conversion element, such as a phototransistor, which is capable of receiving infrared light. The light receiving element 3 is arranged in the recess 1b of the substrate 1. In this embodiment, the light receiving element 3 is entirely accommodated in the recess 1b. The light receiving element 3 is bonded to the pad electrode 121b, which constitutes the inner surface of the recess 1b of the substrate 1, via e.g. silver paste and electrically connected to the pad electrode 121b. The light receiving element 3 is electrically connected also to the bonding pad 122b via a bonding wire Wb.

The projection 4 is provided to stand on the first surface 1A between the recesses 1a and 1b of the substrate 1 and made of a material which blocks infrared light. In this embodiment, the projection 4 is made up of a plurality of laminated copper plating layers.

The molded resin 5 covers the first surface 1A side of the substrate 1 and includes portions 5a and 5b. The portion 5a covers the recess 1a and its nearby portion of the substrate 1 and also covers the light emitting element 2 arranged in the recess 1a. The portion 5b covers the recess 1b and its nearby portion of the substrate 1 and also covers the light receiving element 3 arranged in the recess 1b. In this embodiment, the molded resin 5 is made of an epoxy resin to which dye is added. As the dye, use is made of a substance which absorbs visible light. As illustrated in FIG. 2, the projection 4 penetrates the molded resin 5 to divide the molded resin 5 into the portions 5a and 5b.

The reflection film 6 is a filter of the present invention. The reflection film 6 is provided on the molded resin 5 on the side opposite the substrate 1. The reflection film 6 includes a portion facing the light receiving element 3. The transmittance of the reflection film 6 for infrared light is higher than that for visible light.

Figure 3:
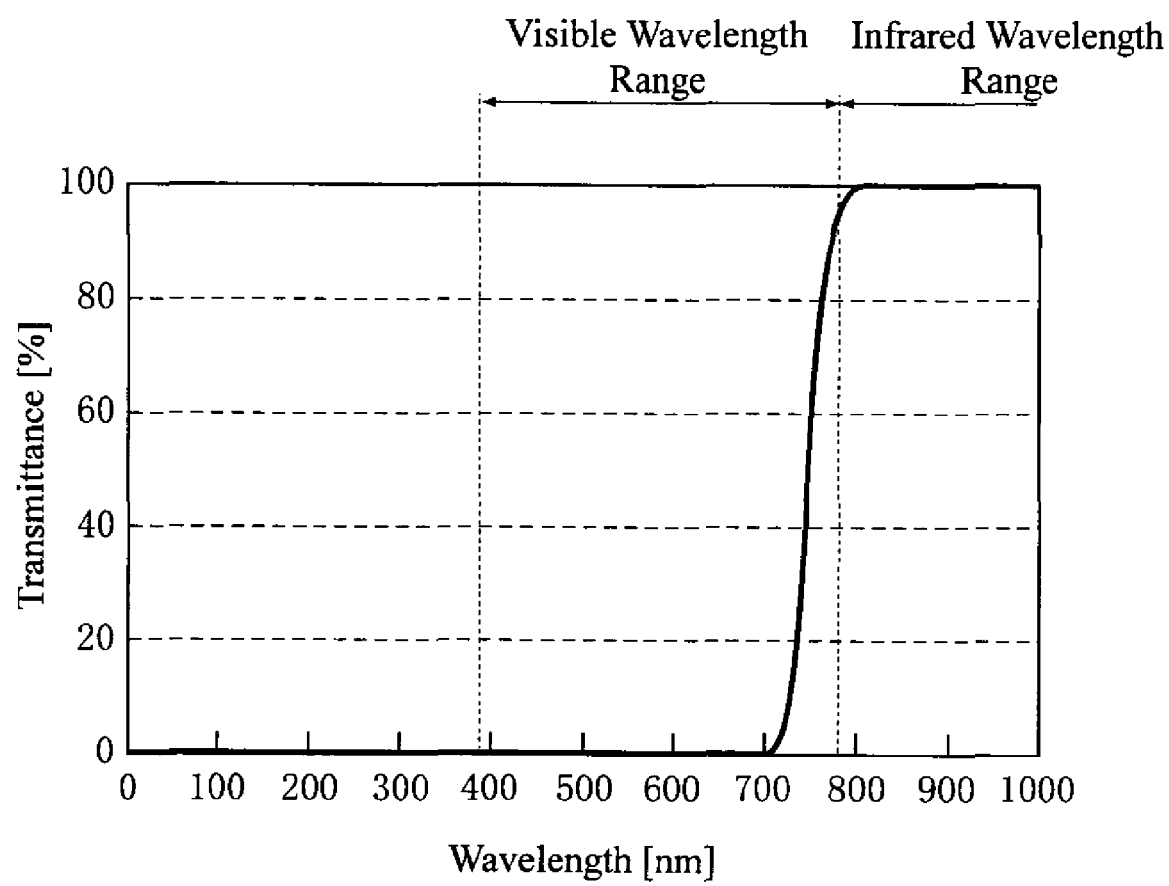
FIG. 3 is a graph illustrating an example of light transmittance characteristics of a reflection film.

FIG. 3 is a graph illustrating an example of light transmittance characteristics of the reflection film 6. The light transmittance shown in the graph is e.g. the transmittance of the reflection film 6 for the wavelengths of the light traveling from the upper side toward the lower side in FIG. 2.

The reflection film 6 reflects substantially all the visible light traveling outside the photointerrupter X1 from the upper side toward the lower side in FIG. 2. Thus, the transmittance of the reflection film 6 for the visible light traveling from the upper side toward the lower side in FIG. 2 is extremely low. The transmittance of the reflection film 6 for visible light is preferably not more than 5% and ideally 0%. On the other hand, the reflection film 6 transmits substantially all the infrared light traveling from the upper side toward the lower side in FIG. 2. Thus, the transmittance of the reflection film 6 for the infrared light traveling from the upper side toward the lower side in FIG. 2 is extremely high. Further, the transmittance of the reflection film 6 for the infrared light emitted from the light emitting element 2 is also extremely high. The transmittance of the reflection film 6 for infrared light is preferably not less than 95% and ideally 100%.

That is, the reflection film 6 of this embodiment is a so-called cold mirror which transmits infrared light and reflects visible light.

As described above, the transmittance characteristics of the reflection film 6 for the infrared wavelength range and the transmittance characteristics of the reflection film 6 for the visible wavelength range differ largely. Preferably, therefore, the first wavelength range related to the reflection film 6 in the present invention is the infrared wavelength range, whereas the second wavelength range, which does not overlap the first wavelength range and is on the shorter wavelength side of the first wavelength range, related to the reflection film 6 in the present invention is the visible wavelength range.

More preferably, the first and the second wavelength ranges are as follows. The first wavelength range is an infrared wavelength partial range that does not include a first boundary wavelength range. Herein, the first boundary wavelength range is part of the infrared wavelength range and continuous with the visible wavelength range. The second wavelength range is a visible wavelength partial range that does not include a second boundary wavelength range. Herein, the second boundary wavelength range is part of the visible wavelength range and continuous with the infrared wavelength range. The first and the second boundary wavelength ranges form a third wavelength range. The third wavelength range is a wavelength range in which transmittance of the filter for light of the third wavelength range changes transitively between the transmittance for light of the first wavelength range and the transmittance for light of the second wavelength range. In FIG. 3, for example, the third wavelength range is a wavelength range in which the transmittance characteristics, depicted by a bold line, is not flat.

The object to be detected 7 illustrated in FIG. 2 may be part of the housing of a foldable mobile phone. When the mobile phone incorporating the photointerrupter X1 is folded, the object to be detected 7 faces the reflection film 6 side of the photointerrupter X1, as illustrated in FIG. 2. When the mobile phone is not folded, the object to be detected 7 does not face the reflection film 6 side of the photointerrupter X1.

Figure 4A:
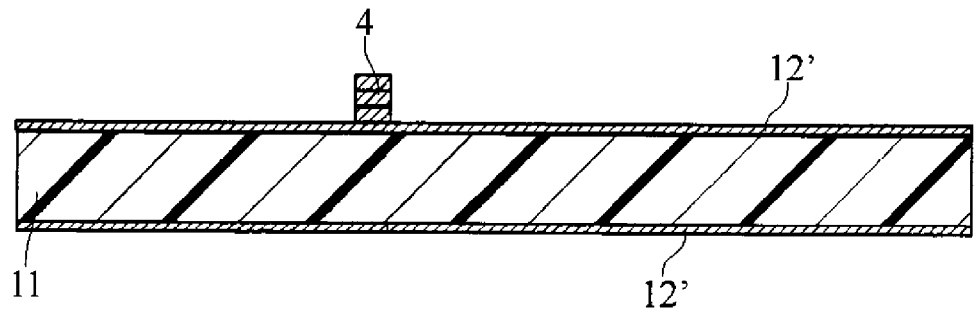
FIGS. 4A-4D illustrate part of the process for making the photointerrupter illustrated in FIGS. 1 and 2.

FIGS. 4A-4D illustrate part of the process for making the photointerrupter X1. To make the photointerrupter X1, a conductor film 12' is formed on a base member 11, and then, a projection 4 is formed on the conductor film 12', as illustrated in FIG. 4A. The conductor film 12' can be formed by electroless plating or electroplating. As the plating material for forming the conductor film 12', use may be made of copper. The projection 4 can be formed by laminating a plurality of conductor films by a wiring pattern forming technique utilizing electroless plating or electroplating. As the plating material for forming the projection 4, use may be made of copper.

Figure 4B:
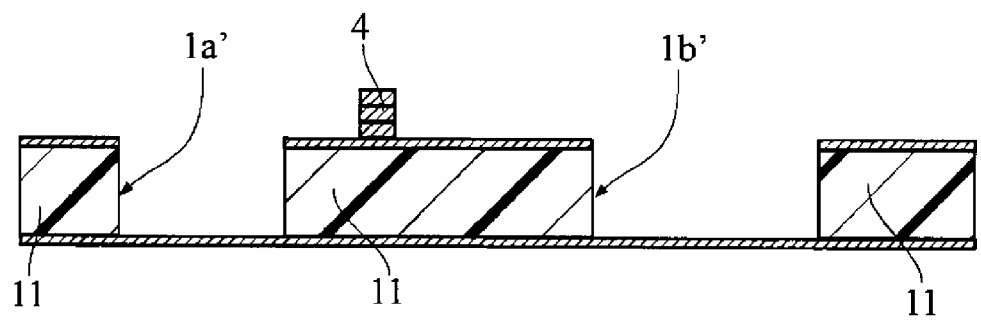

Then, as illustrated in FIG. 4B, recesses 1a' and 1b' are formed. The recesses 1a' and 1b' can be formed by the YAG laser irradiation or $CO_2$ laser irradiation. To form the recesses by $CO_2$ laser irradiation, the conductor film 12' on the upper surface side of the substrate illustrated in FIG. 4A is partially etched away at locations where the recesses are to be formed, and then the base member 11 is subjected to laser beam irradiation.

Figure 4C:
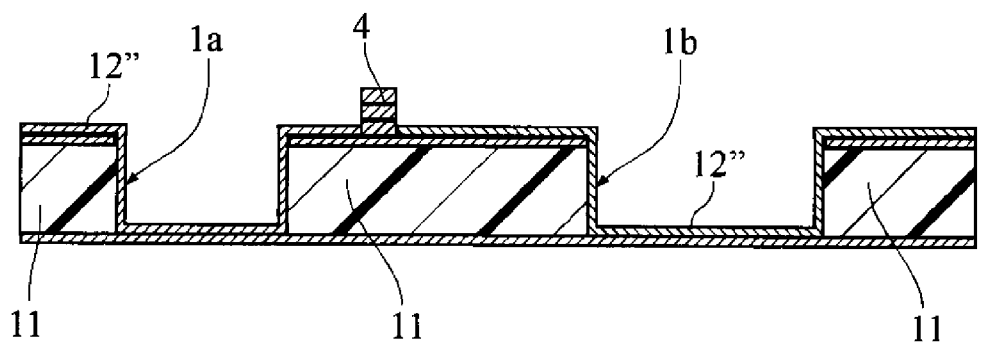

Then, as illustrated in FIG. 4C, a conductor film 12" is formed. The conductor film 12" can be formed by electroless plating or electroplating. As the plating material for forming the conductor film 12", use may be made of copper. In this step, the recesses 1a and 1b having an inner surface made of the conductor film 12" are formed.

Figure 4D:
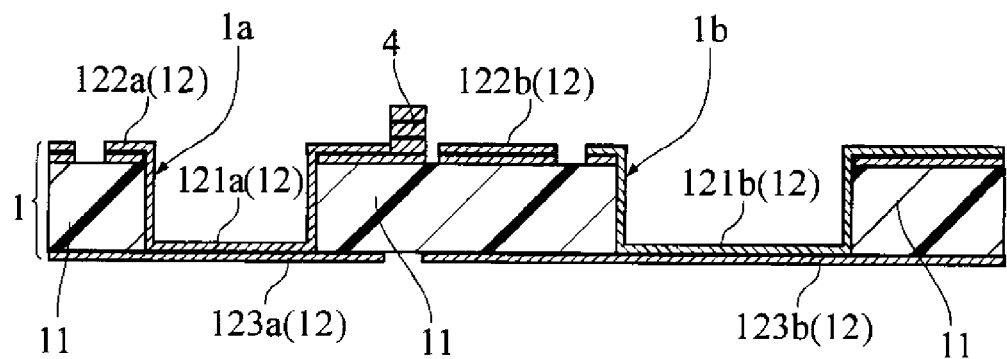

Then, as illustrated in FIG. 4D, the conductor films 12' and 12" are patterned. By this step, the wiring pattern 12 is formed (which includes pad electrodes 121a, 121b, bonding pads 122a, 122b and mount electrodes 123a, 123b)

Thereafter, a light emitting element 2 and a light receiving element 3 are bonded to the pad electrodes 121a and 121b via e.g. silver paste, respectively. The bonding pad 122a and the light emitting element 2 are connected to each other by wire bonding, and the bonding pad 122b and the light receiving element 3 are connected to each other by wire bonding. Then, after a molded resin 5 is provided on the substrate 1, a reflection film 6 is provided on the molded resin 5. In this way, the photointerrupter X1 is made.

When the photointerrupter X1 is in operation, infrared light is emitted from the light emitting element 2. The infrared light passes through the reflection film 6 to exit the photointerrupter X1. Thereafter, when the infrared light is reflected by the object to be detected 7 toward the light receiving element 3, the reflected infrared light passes through the reflection film 6 to enter the photointerrupter X1 to be received by the light receiving element 3. In accordance with the amount of light received, the light receiving element 3 generates an electromotive force to output a signal. Based on the output signal, the object to be detected 7 is detected. When the infrared light from the light emitting element 2 is not reflected by the object to be detected 7, the light receiving element 3 does not receive the infrared light originating from the light emitting element 2, so that the object to be detected is not detected. In this way, by utilizing the photointerrupter X1, information such as whether or not the object to be detected 7 is facing the photointerrupter X1 is obtained.

In the photointerrupter X1, the light emitting element 2 is arranged in the recess 1a of the substrate 1. This arrangement is suitable for reducing the dimension between the second surface 1B of the substrate 1 and the portion of the light emitting element 2 which is farthest from the second surface 1B. Further, the light receiving element 3 is arranged in the recess 1b of the substrate 1. This arrangement is suitable for reducing the dimension between the second surface 1B of the substrate 1 and the portion of the light receiving element 3 which is farthest from the second surface 1B. Thus, the arrangement of the photointerrupter X1 is suitable for thickness reduction. In this embodiment, the entirety of the light emitting element 2 is accommodated in the recess 1a, and the entirety of the light receiving element 3 is accommodated in the recess 1b. This arrangement contributes to the thickness reduction of the photointerrupter X1.

In the photointerrupter X1, since the light emitting element 2 is arranged in the recess 1a of the substrate 1, the bonding wire Wa for electrically connecting the light emitting element 2 to the bonding pad 122a is positioned at a low height from the first surface 1A of the substrate 1. Further, since the light receiving element 3 is arranged in the recess 1b of the substrate 1, the bonding wire Wb for electrically connecting the light receiving element 3 to the bonding pad 122b is positioned at a low height from the first surface 1A. These arrangements contribute to the thickness reduction of the photointerrupter X1.

In the photointerrupter X1, the mount electrode 123a includes a portion overlapping the pad electrode 121a, on which the light emitting element 2 is bonded, in the in-plane direction D of the substrate 1. With this arrangement, the distance between the pad electrode 121a and the mount electrode 123a is shortened, so that the heat generated at the light emitting element 2 is readily dissipated to the outside of the photointerrupter X1 through the pad electrode 121a and the mount electrode 123a. (The mount electrode 123a has excellent heat dissipation ability because of being made of a conductive material which is a good heat conductor and because of having a relatively large area.) Further, the mount electrode 123b includes a portion overlapping the pad electrode 121b, on which the light receiving element 3 is bonded, in the in-plane direction D of the substrate 1. With this arrangement, the distance between the pad electrode 121b and the mount electrode 123b is shortened, so that the heat generated at the light receiving element 3 is readily dissipated to the outside of the photointerrupter X1 through the pad electrode 121b and the mount electrode 123b. (The mount electrode 123b has excellent heat dissipation ability because of being made of a conductive material which is a good heat conductor and because of having a relatively large area.) Thus, the photointerrupter X1 is suitable for achieving high heat dissipation efficiency. Moreover, in this embodiment, since the pad electrode 121a and the mount electrode 123a are in contact with each other, the heat generated at the light emitting element 2 is directly transferred from the pad electrode 121a to the mount electrode 123a. Further, since the pad electrode 121b and the mount electrode 123b are in contact with each other, the heat generated at the light receiving element 3 is directly transferred from the pad electrode 121b to the mount electrode 123b. These arrangements also contribute to the achievement of high heat dissipation efficiency of the photointerrupter X1.

In the photointerrupter X1, the pad electrode 121a forms the inner surface of the recess 1a of the substrate 1, whereas the pad electrode 121b forms the inner surface of the recess 1b. With this arrangement, the infrared light emitted from the light emitting element 2 is prevented from passing through the base member 11 to reach the light receiving element 3. This contributes to the enhancement of the S/N ratio with respect to the detection sensitivity of the photointerrupter X1.

In the photointerrupter X1, the projection 4 blocks the light path from the light emitting element 2 to the light receiving element 3 within the molded resin 5. With this arrangement, the infrared light emitted from the light emitting element 2 is prevented from passing through the molded resin 5 to reach the light receiving element 3. This contributes to the enhancement of the S/N ratio with respect to the detection sensitivity of the photointerrupter X1.

Figure 7:
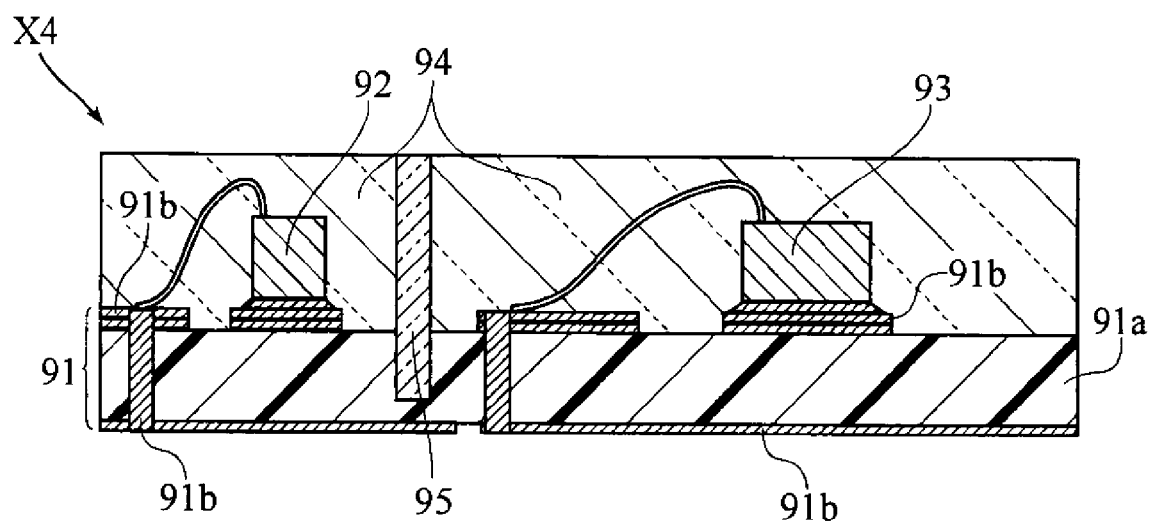
FIG. 7 is a sectional view illustrating a conventional reflection-type photointerrupter.

Since the light emitting element 2 and the light receiving element 3 are arranged in the recesses 1a and 1b of the substrate 1 in the photointerrupter X1, the molded resin 5, which needs to be formed to such an extent as to sufficiently cover the light emitting element 2 and the light receiving element 3, can be formed to have a relatively small thickness from the first surface 1A of the substrate 1. Thus, in the process for making the photointerrupter X1, the projection 4 can be formed before the formation of the molded resin 5. The projection 4 can be formed by a wiring pattern forming technique similarly to the wiring pattern 12. In the process for making the photointerrupter X1, it is not necessary to form the light-shielding resin 95 as illustrated in FIG. 7 as a light-shielding portion. The light-shielding resin 95 shown in FIG. 7 may be formed by forming a molded resin 94 on a substrate 91, forming a through-hole in the molded resin 94, forming a recess in the substrate 91 at a location facing the through-hole and then loading a resin material into the through-hole and the recess. The photointerrupter X1 including the above-described projection 4 can eliminate such complicated manufacturing process, and hence, is suitable for simplifying the manufacturing process.

With the photointerrupter X1, information such as whether or not the object to be detected 7 is facing the photointerrupter Xi is obtained properly even under strong sunlight. The reason is as follows.

The reflection film 6 reflects substantially all the light of the visible range included in sunlight and does not transmit the light of the visible range to the inside of the photointerrupter X1. Even if visible light in sunlight passes through the reflection film 6, the light is absorbed by the molded resin 5 with dye. Thus, the light receiving element 3 does not substantially receive visible light in sunlight. Moreover, the intensity of the light of the infrared range included in sunlight is considerably low. Thus, the light receiving element 3 is not influenced by sunlight and exhibits only a low output even under sunlight. Thus, with the photointerrupter X1, it is possible to avoid such a situation that the object to be detected 7 is determined to be facing the photointerrupter X1 although it is not actually facing the photointerrupter X1. In the case where the photointerrupter X1 is incorporated in a foldable mobile phone, it is possible to avoid such a situation that the mobile phone is determined to be folded although it is actually in the open state.

When the object to be detected 7 is facing the photointerrupter X1, the light receiving element 3 receives strong infrared light emitted from the light emitting element 2 and reflected by the object to be detected 7. Thus, the light receiving element 3 exhibits a high output. In the case where the photointerrupter X1 is incorporated in a foldable mobile phone, the light receiving element 3 exhibits a high output as a result of receiving strong infrared light emitted from the light emitting element 2 and reflected by part of the housing of the mobile phone (object to be detected 7) when the mobile phone is folded and part of the mobile phone housing is facing the photointerrupter X1.

In this way, with the photointerrupter X1, information such as whether or not the object to be detected 7 is facing the photointerrupter X1 is properly obtained even when used under strong sunlight. When the photointerrupter X1 is incorporated in a foldable mobile phone, the open/close state of the mobile phone is properly grasped by the photointerrupter X1.

Figure 5:
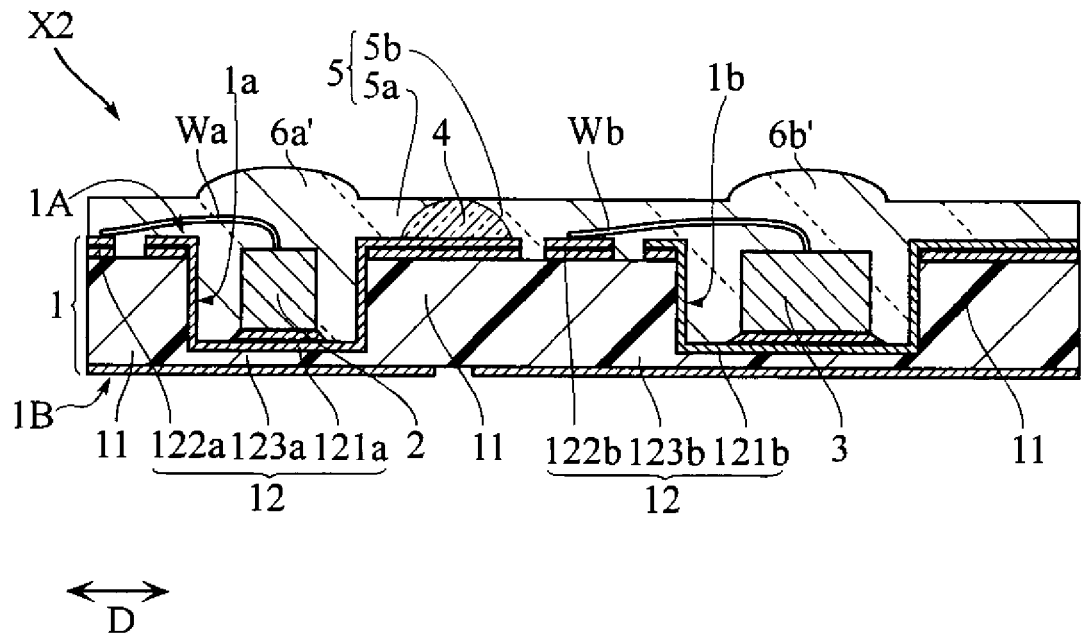
FIG. 5 is a sectional view illustrating a photointerrupter according to a second embodiment of the present invention.

FIG. 5 is a sectional view illustrating a photointerrupter X2 according to a second embodiment of the present invention. The photointerrupter X2 includes a substrate 1, a light emitting element 2, a light receiving element 3, a projection 4' and a molded resin 5. The photointerrupter X2 is different from the foregoing photointerrupter X1 in that the pad electrodes 121a, 121b are spaced from the mount electrodes 123a, 123b, a projection 4' is provided instead of the projection 4, the reflection film 6 is eliminated and the molded resin 5 includes lens portions 5a', 5b'.

The projection 4' is provided on the first surface 1A between the recesses 1a and 1b of the substrate 1 and made of a resin material which blocks infrared light. The upper end of the projection 4' in the figure reaches the upper end of the molded resin 5 in the figure. The projection 4' is formed on the first surface 1A before the molded resin 5 is formed on the first surface 1A side of the substrate I.

The lens portion 5a' of the molded resin 5 is provided at a location corresponding to the light emitting element 2. The lens portion 5a' is provided to widen the directivity angle of the infrared light, which originates from the light emitting element 2, in exiting the photointerrupter X2 or the molded resin 5.

The lens portion 5b' is provided at a location corresponding to the light receiving element 3. The lens portion 5b' is provided to widen the directivity angle of the infrared light, which is to be received by the light receiving element 3, in entering the photointerrupter X2 or the molded resin 5.

The photointerrupter X2 having the above-described structure is suitable for thickness reduction for the same reasons as those described above with respect to the photointerrupter X1.

In the photointerrupter X2, the mount electrode 123a includes a portion overlapping the pad electrode 121a, on which the light emitting element 2 is bonded, in the in-plane direction D of the substrate 1. With this arrangement, the distance between the pad electrode 121a and the mount electrode 123a is shortened, so that the heat generated at the light emitting element 2 is readily dissipated to the outside of the photointerrupter X2 through the pad electrode 121a and the mount electrode 123a. (The mount electrode 123a has excellent heat dissipation ability because of being made of a conductive material which is a good heat conductor and because of having a relatively large area.) Further, the mount electrode 123b includes a portion overlapping the pad electrode 121b, on which the light receiving element 3 is bonded, in the in-plane direction D of the substrate 1. With this arrangement, the distance between the pad electrode 121b and the mount electrode 123b is shortened, so that the heat generated at the light receiving element 3 is readily dissipated to the outside of the photointerrupter X2 through the pad electrode 121b and the mount electrode 123b. (The mount electrode 123b has excellent heat dissipation ability because of being made of a conductive material which is a good heat conductor and because of having a relatively large area.) Thus, the photointerrupter X2 is suitable for achieving high heat dissipation efficiency.

In the photointerrupter X2, the pad electrode 121a forms the inner surface of the recess 1a of the substrate 1, whereas the pad electrode 121b forms the inner surface of the recess 1b. With this arrangement, the infrared light emitted from the light emitting element 2 is prevented from passing through the base member 11 to reach the light receiving element 3. This contributes to the enhancement of the S/N ratio with respect to the detection sensitivity of the photointerrupter X2.

In the photointerrupter X2, the projection 4' blocks the light path from the light emitting element 2 to the light receiving element 3 within the molded resin 5. With this arrangement, the infrared light emitted from the light emitting element 2 is prevented from passing through the molded resin 5 to reach the light receiving element 3. This contributes to the enhancement of the S/N ratio with respect to the detection sensitivity of the photointerrupter X2.

In the photointerrupter X2, the lens portion 5a' of the molded resin 5 provides a wide directivity angle with respect to the exiting infrared light originating from the light emitting element 2. Further, the lens portion 5b' provides a wide directivity angle with respect to the entering infrared light traveling toward the light receiving element 3. Thus, the photointerrupter X2 is suitable for increasing the area and angle of the detectable region.

Figure 6:
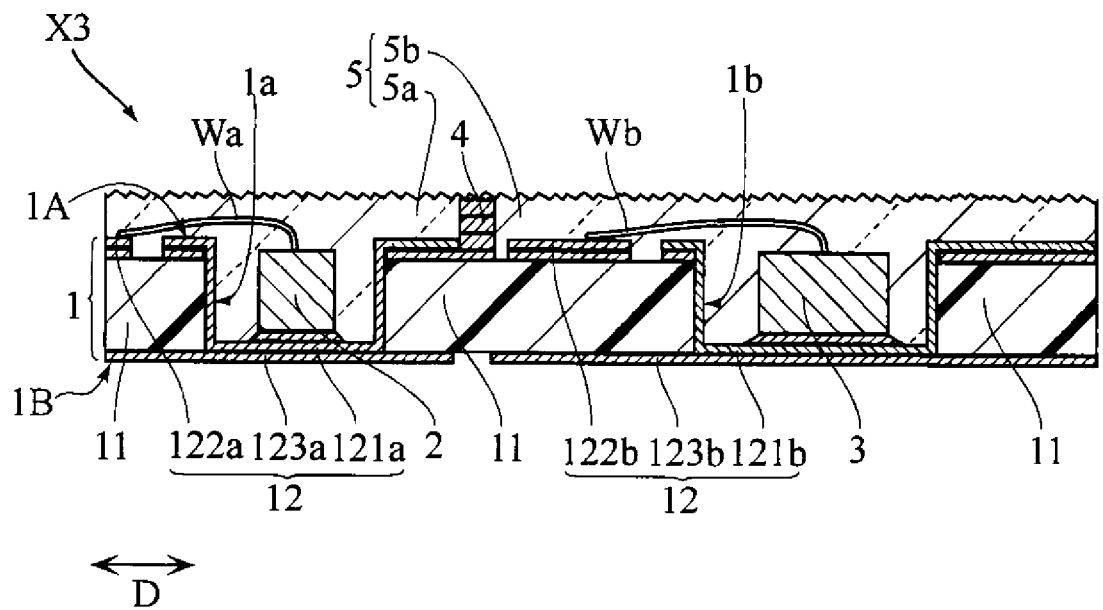
FIG. 6 is a sectional view illustrating a photointerrupter according to a third embodiment of the present invention.

FIG. 6 is a sectional view illustrating a photointerrupter X3 according to a third embodiment of the present invention. The photointerrupter X3 includes a substrate 1, a light emitting element 2, a light receiving element 3, a projection 4 and a molded resin 5. The photointerrupter X3 is different from the foregoing photointerrupter X1 in that the reflection film 6 is eliminated and the molded resin 5 includes a surface 5'.

The surface 5' of the molded resin 5 of the photointerrupter X3 is the upper end surface of the molded resin 5 in FIG. 6 and includes minute irregularities formed by graining or engraving. The difference in height of the minute irregularities of the surface 5' is e.g. 1 to 20 μm.

The photointerrupter X3 having the above-described structure is suitable for thickness reduction for the same reasons as those described above with respect to the photointerrupter X1. Further, the photointerrupter X3 is suitable for achieving high heat dissipation efficiency for the same reasons as those described above with respect to the photointerrupter X1.

In the photointerrupter X3, the pad electrode 121a forms the inner surface of the recess 1a of the substrate 1, whereas the pad electrode 121b forms the inner surface of the recess 1b. With this arrangement, the infrared light emitted from the light emitting element 2 is prevented from passing through the base member 11 to reach the light receiving element 3. This contributes to the enhancement of the S/N ratio with respect to the detection sensitivity of the photointerrupter X3.

In the photointerrupter X3, the projection 4 blocks the light path from the light emitting element 2 to the light receiving element 3 within the molded resin 5. With this arrangement, the infrared light emitted from the light emitting element 2 is prevented from passing through the molded resin 5 to reach the light receiving element 3. This contributes to the enhancement of the S/N ratio with respect to the detection sensitivity of the photointerrupter X3.

The surface 5' (grained or engraved surface) of the molded resin 5 of the photointerrupter X3 enhances the infrared light transmittance of the upper end surface of the molded resin 5 in FIG. 6.

The reflection-type photointerrupter according to the present invention is not limited to the foregoing embodiments. The specific structure of each part of the reflection-type photointerrupter according to the present invention may be varied in design in many ways. Examples of variations are as follows.

In the photointerrupter X1, the molded resin 5 may include lens portions 5a' and 5b' illustrated in FIG. 5.

In the photointerrupter X1, the reflection film 6 does not necessarily need to be provided on the molded resin 5 but may be provided at any position within the path of the light traveling toward the light receiving element 3.

The photointerrupter X1 may include a filter for absorbing light of the second wavelength range (such as visible wavelength range) instead of the reflection film 6.

In the photointerrupter X1, the above-described first wavelength range may be the wavelength range of yellow light or red light, whereas the above-described second wavelength range maybe the wavelength range of blue light or green light. In this case, as the reflection film 6 (filter), use is made of e.g. a band pass filter corresponding to such the first and second wavelength ranges.

The photointerrupter X1 may include a transparent film arranged between the reflection film 6 and the molded resin 5.

In the photointerrupters X1 and X3, the pad electrode 121a and the mount electrode 123a may be integrally made of an electrically conductive material. Similarly, in the photointerrupters X1 and X3, the pad electrode 121b and the mount electrode 123b may be integrally made of an electrically conductive material.

In the photointerrupter X2, instead of providing the lens portions 5a' and 5b', the upper end surface of the molded resin 5 in FIG. 5 may be grained or engraved as described with respect to the photointerrupter X3.

In the photointerrupters X1-X3, the light emitting element 2 does not necessarily need to be arranged on the bottom surface of the recess 1a. Instead, the light emitting element 2 may be arranged on a side surface of the recess 1a. In this case, of the side surfaces of the recess 1a, the side surface which faces the light emitting surface of the light emitting element 2 may be made inclined substantially 45 degrees with respect to the thickness direction of the substrate 1. With this arrangement, the inclined side surface serves as a reflection surface so that the light from the light emitting element 2 is properly emitted to the outside of the photointerrupter.

In the photointerrupters X1-X3, the light receiving element 3 does not necessarily need to be arranged on the bottom surface of the recess 1b. Instead, the light receiving element 3 may be arranged on a side surface of the recess 1b. In this case, of the side surfaces of the recess 1b, the side surface which faces the light receiving surface of the light receiving element 3 may be made inclined substantially 45 degrees with respect to the thickness direction of the substrate 1. With this arrangement, the inclined side surface serves as a reflection surface so that the light having entered the photointerrupter properly reaches the light receiving element 3.

In the photointerrupters X1-X3, the inner surface of the recess 1a of the substrate 1 may be curved. This arrangement contributes to enhance the radiant intensity of the light originating from the light emitting element 2 and exiting the photointerrupter.

In the photointerrupters X1-X3, the inner surface of the recess 1b of the substrate 1 may be curved. This arrangement contributes to enhance the effectual reception sensitivity of the light receiving element 3.

The invention claimed is:

1. A reflection-type photointerrupter comprising:
    a substrate including a first surface, a second surface opposite the first surface, and a first recess and a second recess that are open at the first surface;
    a light emitting element for emitting light, the light emitting element being located in the first recess; and
    a light receiving element for receiving light emitted from the light emitting element and reflected by an object to be detected, the light receiving element being located in the second recess;
    a molded resin covering the first surface of the substrate and having a front surface that is higher than the first surface of the substrate between the first recess and the second recess; and
    a projection made of a light-shielding material and standing on the first surface of the substrate between the first recess and the second recess, the projection extending to the front surface of the molded resin.

2. The reflection-type photointerrupter according to claim 1, wherein the light emitting element is entirely accommodated in the first recess, whereas the light receiving element is entirely accommodated in the second recess.

3. The reflection-type photointerrupter according to claim 1, wherein: the substrate includes a first pad electrode forming at least part of a surface of the first recess, a second pad electrode forming at least part of a surface of the second recess, and a first mount electrode and a second mount electrodes provided at the second surface of the substrate;
    the light emitting element is bonded to the first pad electrode;
    the light receiving element is bonded to the second pad electrode;
    the first mount electrode includes a portion overlapping the first pad electrode in an in-plane direction of the substrate; and
    the second mount electrode includes a portion overlapping the second pad electrode in the in-plane direction of the substrate.

4. The reflection-type photointerrupter according to claim 3, wherein the first pad electrode and the first mount electrode are in contact with each other, whereas the second pad electrode and the second mount electrode are in contact with each other.

5. The reflection-type photointerrupter according to claim 3, wherein the first pad electrode forms at least part of a bottom surface of the first recess, whereas the second pad electrode forms at least part of a bottom surface of the second recess.

6. The reflection-type photointerrupter according to claim 3, wherein the first pad electrode forms at least part of a side surface of the first recess, whereas the second pad electrode forms at least part of a side surface of the second recess.

7. The reflection-type photointerrupter according to claim 1, wherein the molded resin contains dye.

8. The reflection-type photointerrupter according to claim 1, further comprising a filter provided on the front surface of the molded resin that is opposite to the substrate and including a portion facing the light receiving element, wherein:
    the light emitting element is capable of emitting light of a wavelength range including a first wavelength range; and
    transmittance of the filter for light of the first wavelength range is higher than transmittance of the filter for light of a second wavelength range, the second wavelength range being a shorter wavelength range than the first wavelength range.

9. The reflection-type photointerrupter according to claim 8, wherein the first wavelength range is the infrared wavelength range, whereas the second wavelength range is the visible wavelength range.

10. The reflection-type photointerrupter according to claim 8, wherein the first wavelength range is an infrared wavelength partial range that does not include a first boundary wavelength range, the first boundary wavelength range being part of the infrared wavelength range and continuous with the visible wavelength range;
the second wavelength range is a visible wavelength partial range that does not include a second boundary wavelength range, the second boundary wavelength range being part of the visible wavelength range and continuous with the infrared wavelength range;
the first and the second boundary wavelength ranges form a third wavelength range;
the third wavelength range is a wavelength range in which transmittance of the filter for light of the third wavelength range changes transitively between the transmittance for light of the first wavelength range and the transmittance for light of the second wavelength range.

11. The reflection-type photointerrupter according to claim 8, wherein the filter is a reflection film that is capable of reflecting light of the second wavelength range.

12. The reflection-type photointerrupter according to claim 8, wherein the filter is provided on the molded resin.

13. The reflection-type photointerrupter according to claim 1, further comprising a first mount electrode and a second mount electrode provided on the second surface of the substrate,
wherein the bottom wall of the first pad electrode and the first mount electrode are in direct contact with each other, whereas the bottom wall of the second pad electrode and the second mount electrode are in contact with each other.

14. A reflection-type photointerrupter comprising:
a substrate;
a light emitting element for emitting light of a wavelength range including a first wavelength range, the light emitting element being arranged on the substrate;
a light receiving element for receiving light emitted from the light emitting element and reflected by an object to be detected, the light receiving element being arranged on the substrate;
a molded resin covering the light emitting element and the light receiving element on the substrate; and
a filter provided on a side of the molded resin that is opposite to the substrate and including a portion facing the light receiving element,
wherein transmittance of the filter for light of the first wavelength range is higher than transmittance of the filter for light of a second wavelength range, the second wavelength range being a shorter wavelength range than the first wavelength range.

15. The reflection-type photointerrupter according to claim 14, wherein the first wavelength range is the infrared wavelength range, whereas the second wavelength range is the visible wavelength range.

16. The reflection-type photointerrupter according to claim 14, wherein the first wavelength range is an infrared wavelength partial range that does not include a first boundary wavelength range, the first boundary wavelength range being part of the infrared wavelength range and continuous with the visible wavelength range;
the second wavelength range is a visible wavelength partial range that does not include a second boundary wavelength range, the second boundary wavelength range being part of the visible wavelength range and continuous with the infrared wavelength range;
the first and the second boundary wavelength ranges form a third wavelength range;
the third wavelength range is a wavelength range in which transmittance of the filter for light of the third wavelength range changes transitively between the transmittance for light of the first wavelength range and the transmittance for light of the second wavelength range.

17. The reflection-type photointerrupter according to claim 14, wherein the filter is a reflection film that is capable of reflecting light of the second wavelength range.

18. The reflection-type photointerrupter according to claim 14, wherein the filter is provided on the molded resin.

19. A reflection-type photointerrupter comprising:
a substrate including a first surface, a second surface opposite the first surface, and a first recess and a second recess that are open at the first surface;
a first pad electrode formed in the first recess and including a bottom wall and a side wall upstanding from the bottom wall of the first pad electrode;
a second pad electrode formed in the first recess and including a bottom wall and a side wall upstanding from the bottom wall of the second pad electrode;
a light emitting element mounted on the bottom wall of the first pad electrode in the first recess for emitting light; and
a light receiving element mounted on the bottom wall of the first pad electrode in the first recess for receiving light emitted from the light emitting element and reflected by an object to be detected;
wherein the side wall of the first pad electrode and the side wall of the second pad electrode have a height that is not smaller than a thickness of the substrate defined as a distance between the first and second surfaces of the substrate.

* * * * *